(12) United States Patent
Medeiros

(10) Patent No.: US 7,153,723 B1
(45) Date of Patent: Dec. 26, 2006

(54) METHOD OF FORMING A BALL GRID ARRAY DEVICE

(75) Inventor: Earl Medeiros, Fall River, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 10/727,386

(22) Filed: Dec. 4, 2003

(51) Int. Cl.
*H01L 21/44* (2006.01)

(52) U.S. Cl. ...................... 438/106; 257/698

(58) Field of Classification Search ........ 438/106–109, 438/121, 123, 613, 617; 257/666, 678, 690–692, 257/698, 700, 778
See application file for complete search history.

(56) References Cited

U.S. PATENT DOCUMENTS

| | | | |
|---|---|---|---|
| 6,084,397 | A | 7/2000 | Downes |
| 6,320,758 | B1 | 11/2001 | Chen et al. |
| 6,386,435 | B1 | 5/2002 | Downes |
| 6,404,649 | B1 | 6/2002 | Drake et al. |
| 6,417,463 | B1 * | 7/2002 | Cornelius et al. ........... 174/263 |
| 6,429,645 | B1 | 8/2002 | Downes |
| 6,489,574 | B1 * | 12/2002 | Otaki et al. ................. 174/262 |
| 6,535,005 | B1 | 3/2003 | Field |

* cited by examiner

*Primary Examiner*—David Vu
(74) *Attorney, Agent, or Firm*—Krishnendu Gupta; Scott A. Ouellette

(57) ABSTRACT

A method includes:

A. providing a substrate having a first surface and a second surface, the first surface being adapted for mounting an electronic device thereon;

B. forming a grid of electrically conductive vias extending from a region proximate the first surface to a region proximate the second surface, each via being one of a signal via, a ground via and a power via;

C. removing at least one of the vias to form a void between at least one ground via and at least one power via; and D. connecting each of the at least one ground via proximate the void to one of the at least one power vias proximate the void with a filter device proximate the second surface of the substrate.

13 Claims, 6 Drawing Sheets

METHOD OF FORMING A BALL GRID ARRAY DEVICE

FIELD OF THE INVENTION

The present invention relates generally to a method of forming a ball grid array device and more particularly to a method of forming a ball grid array device to reduce capacitive and inductive effects on the ball grid array.

BACKGROUND OF THE INVENTION

Ball grid arrays (BGA's) formed on multilayer substrates typically include a grid of vias, which are cylindrical structures formed from an electrically conductive material, such as copper, disposed in the substrate in a grid pattern. Typically, the vias extend from one side of the substrate through the various layers therein, to the second side of the substrate. Some of the vias may be connected to ground or a power voltage through one or more of the layers of the substrate, and others of the vias are used to pass electrical signals throughout an attached electrical device. The electrical device, such as an integrated circuit (IC), is attached, through the BGA, to one side of the substrate. The ground and power vias supply ground or power to various pins of the device, and the signal vias interconnect portions of the device to other portions and to other devices on the substrate.

One issue that must be addressed designing and fabricating BGA's is the inductance that is present in the array. Inductance is the ability of a conductor to produce an induced voltage when cut by a magnetic flux. A conductor is a material capable of conveying an electric current. Virtually all conductors have inductance, but the amount of inductance associated with each conductor varies according to a number of factors such as type of conductive material, shape of the conductor, length of the conductor, and so forth. For example, a shorter wire has less inductance than a long wire because less conductor length cut by a magnetic flux produces less voltage. Similarly, a straight wire has less inductance than a coiled wire because the conductor concentrates more conductor length in a given area of flux.

One characteristic of inductors is that the faster the speed at which the flux changes, the more voltage is induced. The flux may take the form of a change in current. For example, alternating current (AC) circuits continually produce an induced voltage because the current is continuously changing. The faster the current changes, the higher the induced voltage, which always opposes the change in current. If current is increased, the polarity of the induced voltage opposes the increase in current, and vice versa. However, it is not necessary for the current to alternate directions. Inductance affects DC circuits whenever the value of the DC current changes, such as when a DC circuit is turned on and off.

There are four types of inductance: system inductance, self-inductance, mutual inductance, and stray inductance. System inductance is a combination of all the self inductances, mutual inductances, and stray inductances found within a circuit. Self inductance is the ability of a conductor to induce voltage in itself when the current changes. Mutual inductance typically occurs whenever two conductors are positioned closely together such that a varying flux resulting from a change in current in Conductor A cuts across and induces voltage in Conductor B. This induced voltage, in turn, generates a magnetic flux that cuts across and induces a voltage in conductor A. Because a current in one conductor can induce voltage in the adjacent conductor, the conductors are said to have mutual inductance. Stray inductance is the inductance of any wiring not included in discrete inductors, for example, traces, capacitors, etc. In most cases, stray inductance is negligible. However, in high frequency circuits, where the current changes very quickly, stray inductance can have appreciable effects. To offset this appreciable effect, traces, leads, and current return path are usually kept as short as possible.

Each of these types of inductance discussed above seriously affects, and in some cases limits, the I/O speeds of integrated circuits. For example, in the case where all the bus outputs of a circuit simultaneously switch the same way, the circuit is deluged with a tidal wave of current. This current surge generates an appreciable induced voltage in the circuit's conductors. The induced voltage flowing opposite to the wave of current, reduces the amount of current flowing through the circuit, thereby slowing the rate of current flow. Furthermore, the induced voltage has other effects on the device signals, such as ground bounce, over/undershoot of the signal waveform and non-monotonic edges on the signal waveform. It is clear that faster I/O times will result if system inductance can be minimized, as well as higher signal integrity.

SUMMARY OF THE INVENTION

The present invention is directed to a method for forming a BGA/PC board which facilitates the connection of power vias in the board to ground vias with bypass and/or decoupling capacitors, which act to reduce the effect of induced voltages on the IC device mounted on the board.

According to one aspect of the invention, the method includes:

A. providing a substrate having a first surface and a second surface, the first surface being adapted for mounting an electronic device thereon, the substrate including a grid of electrically conductive vias extending from a region proximate the first surface to a region proximate the second surface, each via being one of a signal via, a ground via and a power via;

B. removing at least one of the vias to form a void between at least one ground via and at least one power via; and C. connecting each of the at least one ground via proximate the void to one of the at least one power vias proximate the void with a filter device proximate the second surface of the substrate.

The vias removed in Step B may be ground vias. The filter device may include a capacitor. The vias in the grid may be disposed at a first pitch with respect to each other. The void may form a loop around at least one via.

According to another embodiment, a method includes:

A. providing a substrate having a first surface and a second surface, the first surface being adapted for mounting an electronic device thereon;

B. forming a grid of electrically conductive vias extending from a region proximate the first surface to a region proximate the second surface, each via being one of a signal via, a ground via and a power via;

C. removing at least one of the vias to form a void between at least one ground via and at least one power via; and D. connecting each of the at least one ground via proximate the void to one of the at least one power vias proximate the void with a filter device proximate the second surface of the substrate.

According to yet another embodiment, a method includes:

A. providing a substrate having a first surface and a second surface, the first surface being adapted for mounting an electronic device thereon;

B. forming a grid including a plurality of electrically conductive vias extending from a region proximate the first surface to a region proximate the second surface and a void between at least one ground via and at least one power via, each via being one of a signal via, a ground via and a power via and the void being an area lacking at least one via; and C. connecting one of the at least one ground vias proximate the void to at least one of the at least one power vias proximate the void with a filter device proximate the second surface of the substrate.

BRIEF DESCRIPTION OF THE DRAWINGS

These and other features of the invention will become more readily apparent from the following detailed description when read together with the accompanying drawings, in which.

DETAILED DESCRIPTION

Figure 1:
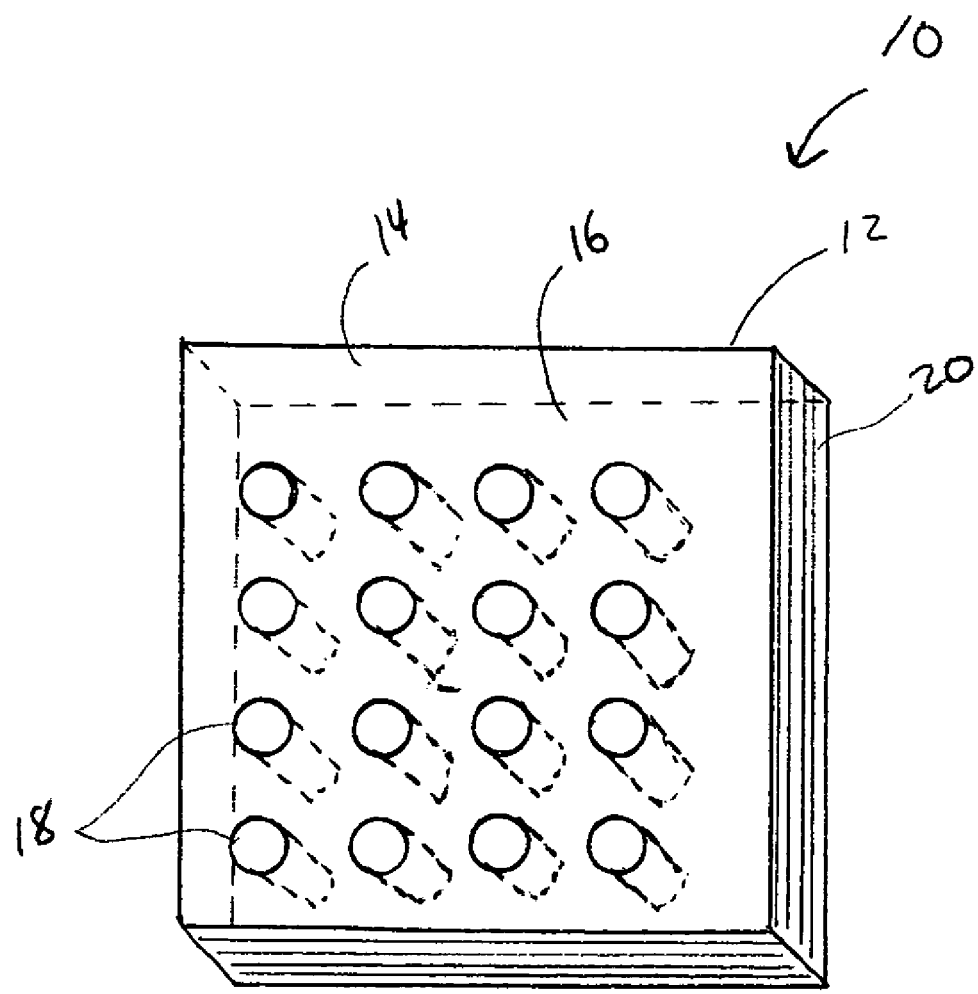
FIG. 1 is a perspective three-dimensional view of a via array.

FIG. 1 is a perspective three-dimensional view of a PC board 10 including a substrate 12 having a first surface 14 and a second surface 16. A plurality of vias 18 is formed in the substrate 12 in a manner known in the art. In the preferred embodiment of the invention, vias 18 extend from first surface 14, through the substrate 12 to the second surface 16. A plurality of electrically conductive layers 20 are disposed within the substrate 20 to deliver power voltage to power vias 18, ground voltage to ground vias 18 and to interconnect signal vias 18. In use, an IC device (not shown), such as a field programmable gate array (FPGA), is mounted to the first surface 14 of the substrate 12 via the BGA. The number of vias shown in the board 10 of FIG. 1 is for example only and it will be understood that any number of vias may be included in a particular PC board.

Figure 2:
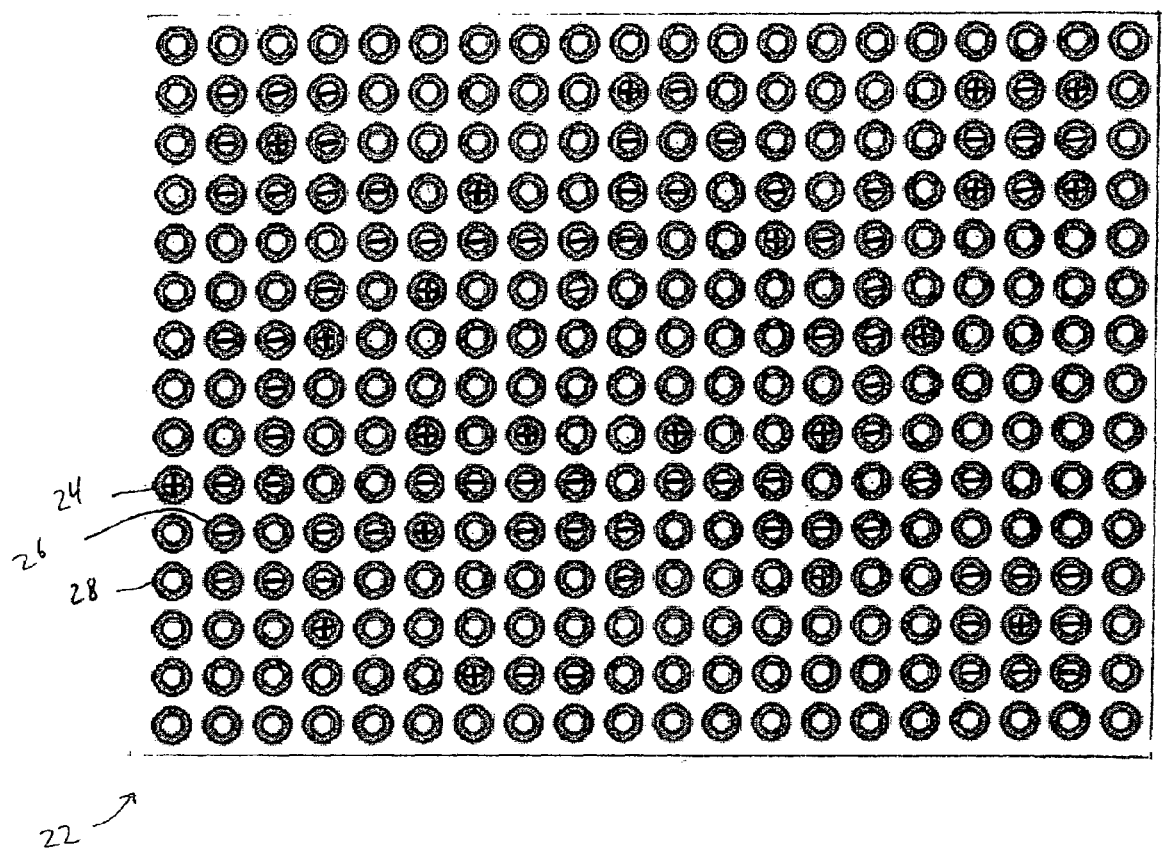
FIG. 2 is a schematic view diagram of a grid array.
Figure 6:
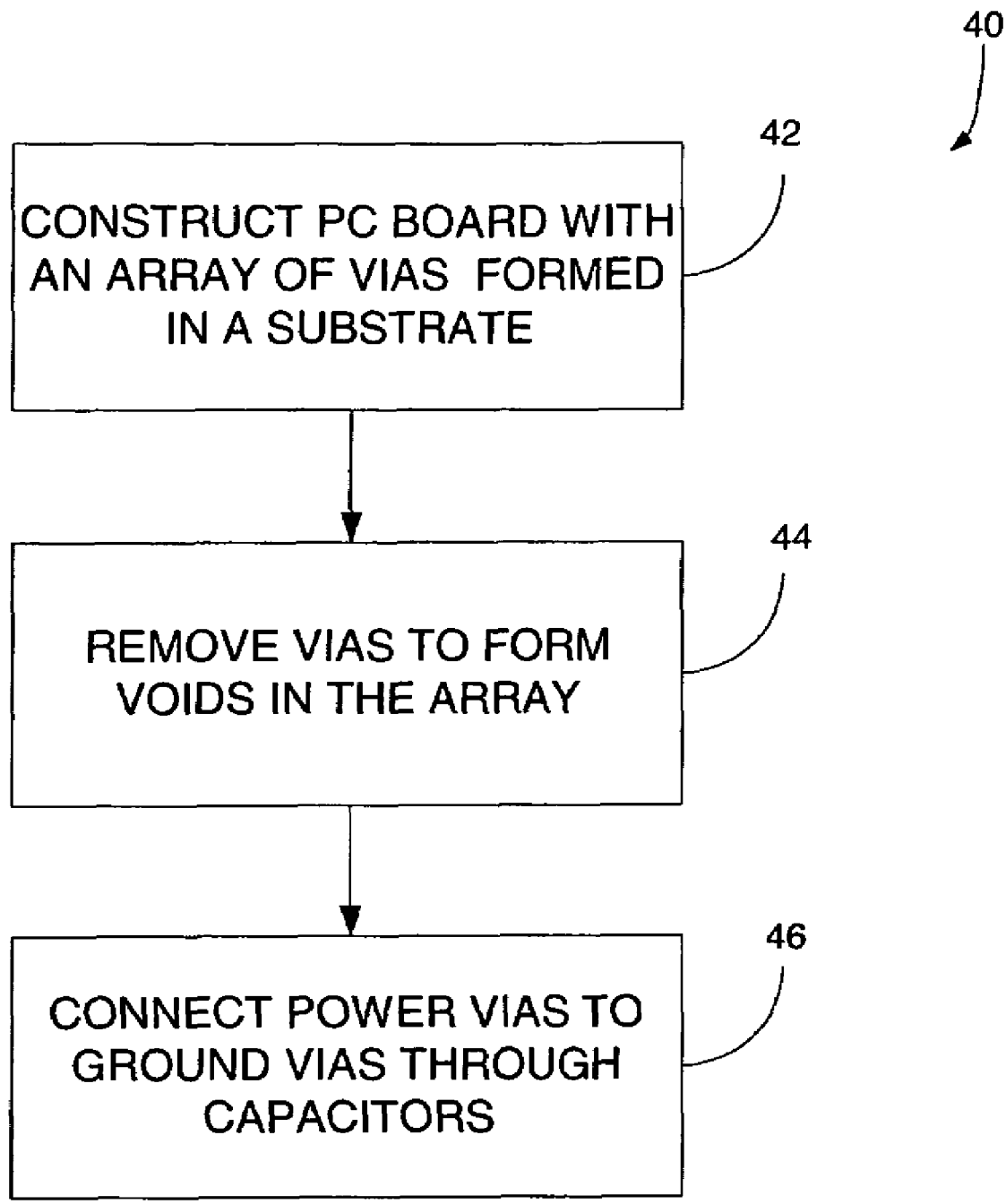
FIG. 6 is a flow diagram showing the steps included in a method of the present invention.

FIG. 2 is a schematic diagram of a via array 22 as seen when looking at the second surface 16 of substrate 12. Array 22 includes power vias 24, indicated with a "+" sign, ground vias 26, indicated with a "−" sign, and signal vias 28, which are blank. The placement of the power, ground and signal vias in the substrate is for the purpose of example only, as the particular placement of the various vias in the substrate is dependent on the design of the IC device that is mounted on the board. As discussed above, the layers 20 in the substrate 12 deliver, depending on the design of the board, power voltage and ground voltage to power vias 24 and ground vias 26, respectively. Other layers 20 interconnect various signal vias 28, as dictated by the particular design of the board 12. As shown in FIG. 6, which is a flow diagram 40 of the method of the present invention, in Step 42, the PC board is constructed or provided with the array of vias 24, 26, 28 formed in the substrate 12.

Figure 3:
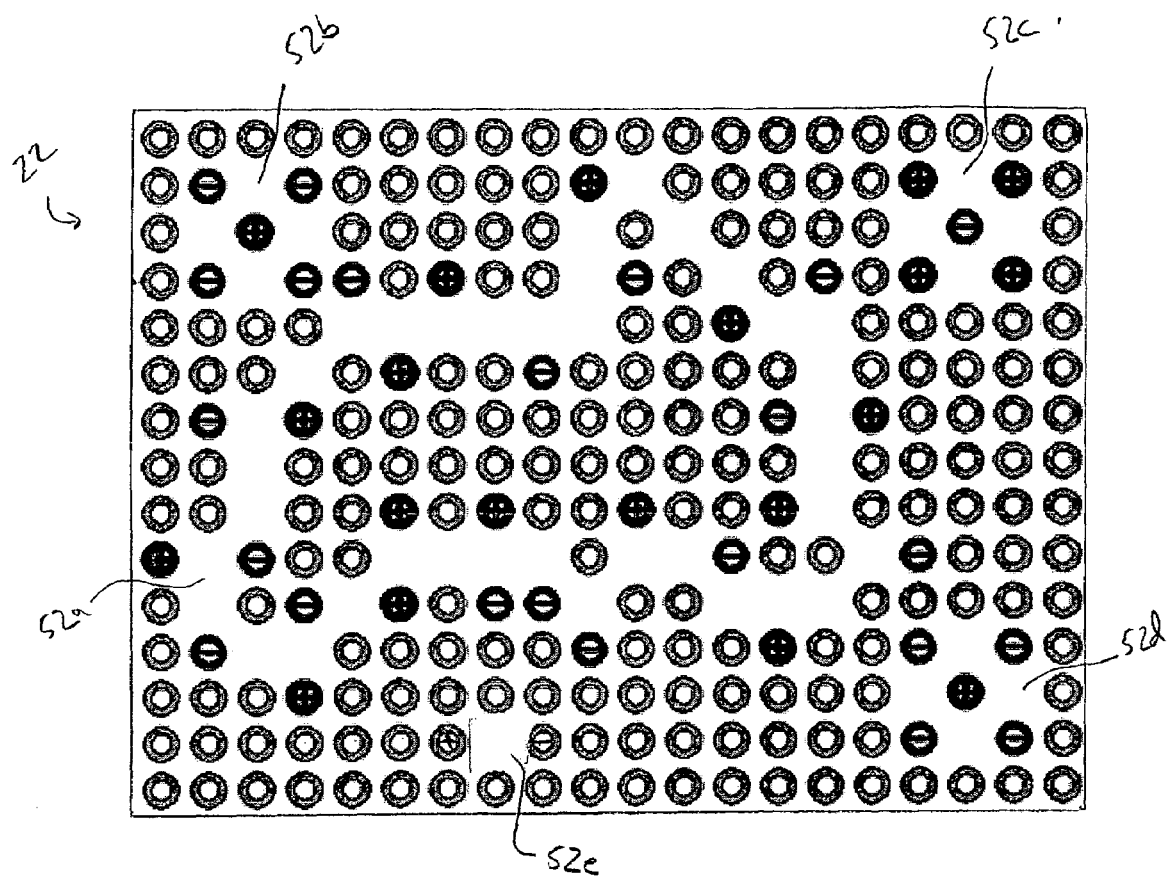
FIG. 3 is a schematic view diagram of a grid array having certain of the vias removed in accordance with the present invention.

In Step 44, certain vias are removed from the substrate to form via void areas 52a, 52b, 52c, 52d and 52e in the array 22, FIG. 3. One preferred hierarchy for the order in which vias would be removed is as follows:

1) Remove unused (unconnected in design) signal vias;

2) Remove unused (unconnected in design) ground vias;

3) Remove unused (unconnected in design) power vias;

4) Remove ground vias (making a tradeoff between ground connections and improved signal quality);

5) Remove power vias (making a tradeoff between power connections and improved signal quality. In most cases, you have duplicate power connections that you can sacrifice); and 6) Remove signal vias.

It will be understood that the order of removing vias listed above is preferred, but that any order of removal may be utilized within the scope of the invention.

By "removing vias", what is meant is that vias may be physically removed from preformed boards that include a full grid of vias, or the vias may be removed from the full-grid design layout of the board prior to the actual formation of the board. In the latter case, Steps 42 and 44 would be modified and combined such that the substrate would be constructed having void areas where vias are not included in certain areas of the array.

Figure 4:
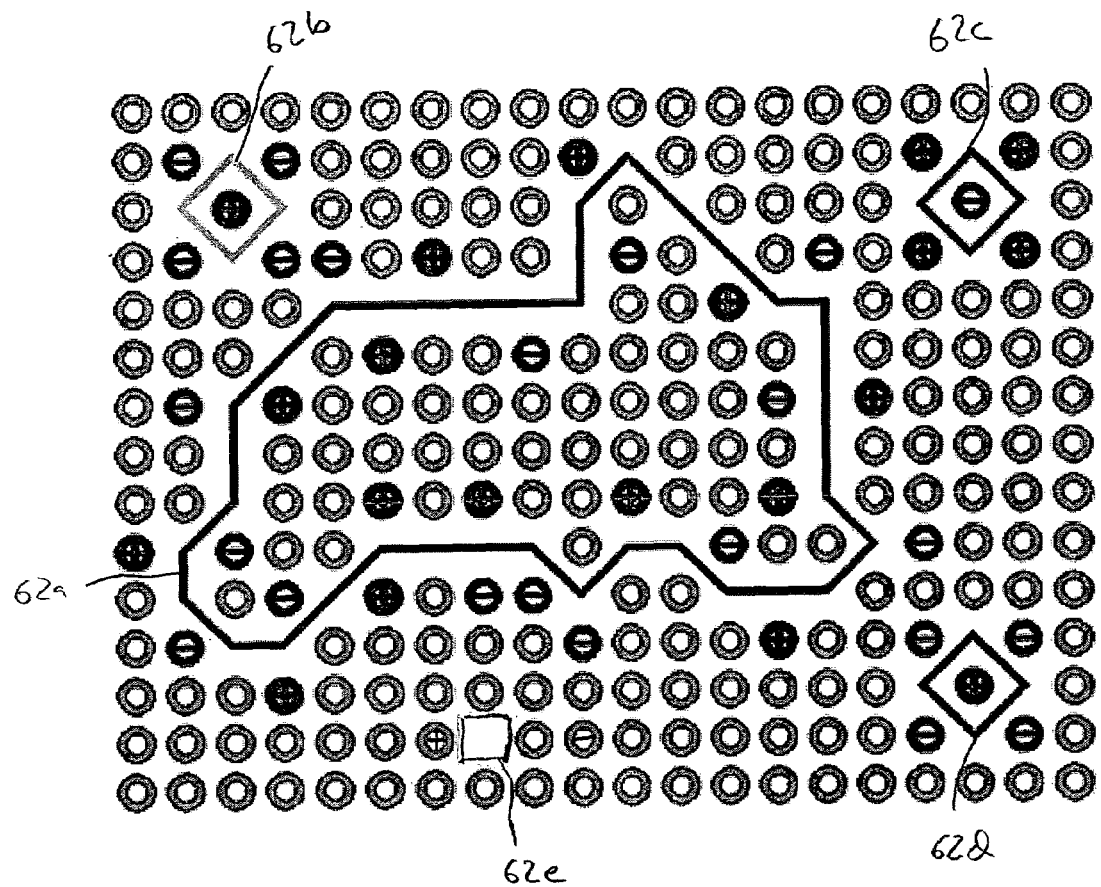
FIG. 4 is a schematic view diagram of a grid array showing outlined via void areas in accordance with the present invention.

FIG. 4 shows loops 62a, 62b, 62c, 62d and 62e, which coincide with the via void areas 52a, 52b, 52c, 52d and 52e. While it is preferred, due to ease of manufacturing, to form the via void areas in a symmetrical loop, such as is shown by loops 62b, 62c and 62d, it is not critical to the invention, and asymmetrical loops, such as loop 62a may be formed. Likewise, a single via can be removed to form a via void area, such as area 62e.

Figure 5:
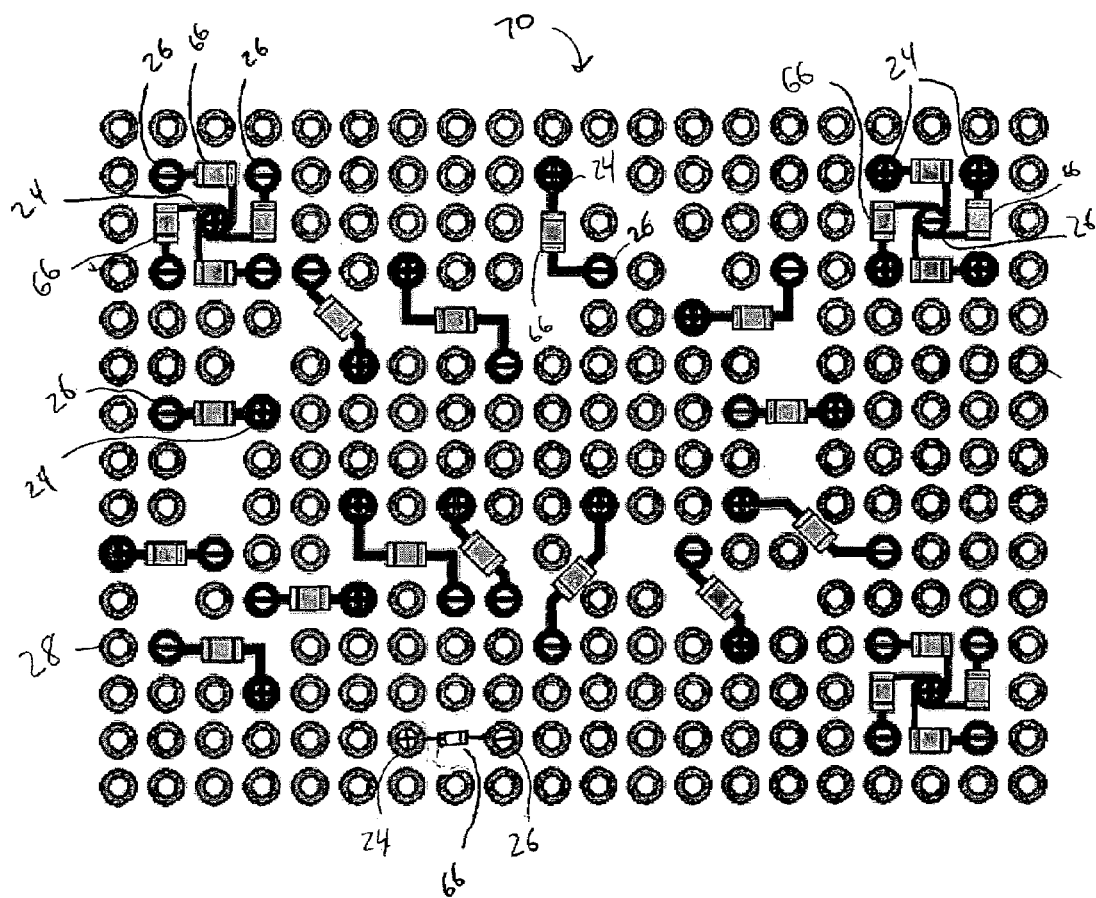
FIG. 5 is a schematic view diagram of a grid array showing capacitors connecting power and ground vias in accordance with the present invention.

In Step 46, each power via 24 is connected to at least one ground via 26 via a capacitor 66, FIG. 5, and each ground via 24 is connected to at least one power via 24 via a capacitor 66. As is shown in FIG. 5, the removal of certain of the vias to form via void areas facilitates the connection of the capacitors 66 between the power vias 24 and the ground vias 26 by providing more room on the board for the placement of the capacitors. As the pitch of the vias on the board decreases with advances in IC design and manufacturing, the available area for mounting capacitors also decreases, making the placement of the capacitors critical to the operation of the IC device. As discussed above, it is extremely important to keep the connections between the power and ground vias as short as possible. The formation of via void areas also enables an increased number of capacitors to be connected between the power and ground vias than was the case in prior art boards and the actual placement of the capacitors is optimized for the particular IC device mounted on the board 12. As the frequencies present on the board proximate the IC device increase, the placement of the capacitor as close to the part becomes more critical.

Capacitors 66 operate to filter induced voltages that occur through the board 12 as described above. In the preferred embodiment, a plurality of values of capacitors is used in order to provide a greater range of filtering and a better frequency response for the board 12. For example, capacitors of 0.1 pF, 1 pF and 10 pF may be used to provide three decades of frequency response for the board 12. This enables the board to filter out a greater range of induced voltage frequencies present on the board 12. It will be understood that the values of the capacitors used can vary greatly and will depend on the operation parameters of the IC device mounted to the board, the amplitude of the induced voltages present on the board and the desired frequency response.

After the capacitors 66 have been connected between the power vias 24 and the ground vias 26, any vias that were previously removed from the board whose area on the second surface of the board was not filled with a capacitor connected between power and ground vias may be replaced in the board for the purpose of maintaining as many vias in the board as possible that may be needed in future implementations of the board.

Accordingly, the present invention provides a method of forming a PC board which facilitates the placement of capacitors on the second surface of the board in order to reduce the induced voltages that may be present on the board which can degrade the operation of the IC device mounted on the board.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

The invention claimed is:

1. A method comprising:
   A. providing a substrate having a first surface and a second surface, the first surface being adapted for mounting an electronic device thereon, the substrate including a grid of electrically conductive vias extending from a region proximate the first surface to a region proximate the second surface, each via being one of a signal via, a ground via and a power via;
   B. removing at least one of the vias to form a void in the substrate between a ground via and a power via; and
   C. connecting the ground via proximate the void to the power via proximate the void with a filter device disposed at the void proximate the second surface of the substrate.

2. The method of claim 1 wherein the vias removed in Step B are ground vias.

3. The method of claim 1 wherein the filter device comprises a capacitor.

4. The method of claim 1 wherein the vias in the grid are disposed at a first pitch with respect to each other.

5. The method of claim 1 wherein the void comprises a loop around at least one via.

6. The method of claim 1 wherein, in Step C, the filter device is disposed proximate the void when connected between the at least one ground via and the at least one power via.

7. A method comprising:
   A. providing a substrate having a first surface and a second surface, the first surface being adapted for mounting an electronic device thereon;
   B. forming a grid of electrically conductive vias extending from a region proximate the first surface to a region proximate the second surface, each via being one of a signal via, a ground via and a power via;
   C. removing at least one of the vias to form a void in the substrate between a ground via and a power via; and
   D. connecting the ground via proximate the void to the power via proximate the void with a filter device disposed at the void proximate the second surface of the substrate.

8. The method of claim 7 wherein the vias removed in Step C are ground vias.

9. The method of claim 7 wherein the filter device comprises a capacitor.

10. The method of claim 7 wherein the vias in the grid are disposed at a first pitch with respect to each other.

11. The method of claim 7 wherein the void comprises a loop around at least one via.

12. The method of claim 7 wherein, in Step D, the filter device is disposed proximate the void when connected between the at least one ground via and the at least one power via.

13. A method comprising:
   A. providing a substrate having a first surface and a second surface, the first surface being adapted for mounting an electronic device thereon, the substrate including a grid of electrically conductive vias extending from a region proximate the first surface to a region proximate the second surface, each via being one of a signal via, a ground via and a power via;
   B. removing at least one of the ground vias to form a void in the substrate between a ground via and a power via; and
   C. connecting the ground via proximate the void to power via proximate the void with a filter device disposed at the void proximate the second surface of the substrate.

* * * * *